United States Patent
Lee

(10) Patent No.: US 9,646,675 B1
(45) Date of Patent: May 9, 2017

(54) DATA TRAINING DEVICE AND SEMICONDUCTOR DEVICE INCLUDING THE SAME

(71) Applicant: SK hynix Inc., Icheon-si, Gyeonggi-do (KR)

(72) Inventor: Tae Yong Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/177,552

(22) Filed: Jun. 9, 2016

(30) Foreign Application Priority Data

Feb. 25, 2016 (KR) .................. 10-2016-0022636

(51) Int. Cl.
| | | |
|---|---|---|
| G11C 7/00 | (2006.01) | |
| G11C 11/4093 | (2006.01) | |
| G11C 11/4074 | (2006.01) | |
| G11C 7/04 | (2006.01) | |
| G11C 7/22 | (2006.01) | |
| G11C 7/10 | (2006.01) | |
| G11C 5/14 | (2006.01) | |

(52) U.S. Cl.
CPC ............ G11C 11/4093 (2013.01); G11C 7/04 (2013.01); G11C 11/4074 (2013.01); *G11C 5/147* (2013.01); *G11C 7/10* (2013.01); *G11C 7/22* (2013.01)

(58) Field of Classification Search
CPC .... G11C 7/04; G11C 7/10; G11C 7/22; G11C 11/4074; G11C 11/4093; G11C 5/14; G11C 5/147
USPC ......... 365/189.05, 189.15, 189.16, 191, 194, 365/226
See application file for complete search history.

(56) References Cited

U.S. PATENT DOCUMENTS

| | | | | |
|---|---|---|---|---|
| 7,734,273 | B2 * | 6/2010 | Komori ................ | H03D 7/1433 455/226.1 |
| 7,825,699 | B2 * | 11/2010 | Hwang .................... | G11C 7/02 327/307 |
| 8,593,901 | B2 | 11/2013 | Oh et al. | |
| 8,631,266 | B2 | 1/2014 | Seol et al. | |
| 2005/0207234 | A1 * | 9/2005 | Baechtold .............. | G11C 29/48 365/189.05 |
| 2010/0253406 | A1 * | 10/2010 | Seefeldt ............... | G11C 7/1057 327/161 |
| 2011/0019493 | A1 * | 1/2011 | Ikeda ..................... | G11C 7/065 365/203 |
| 2013/0058172 | A1 * | 3/2013 | Rao ....................... | G11C 29/026 365/189.05 |
| 2014/0112056 | A1 * | 4/2014 | Tsuji ....................... | G11C 8/08 365/148 |

* cited by examiner

*Primary Examiner* — Tan T. Nguyen
(74) *Attorney, Agent, or Firm* — William Park & Associates Ltd.

(57) ABSTRACT

Disclosed are a data training device and a semiconductor device. The data training device includes a write controller configured to align write data, a read controller configured to latch data applied from the write controller and sequentially output the latched data, and an offset compensator configured to adjust a current flowing through a power supply voltage application terminal and a ground voltage application terminal in correspondence to a write signal and a read signal, thereby compensating for an offset in the write controller and the read controller.

19 Claims, 7 Drawing Sheets

DATA TRAINING DEVICE AND SEMICONDUCTOR DEVICE INCLUDING THE SAME

CROSS-REFERENCES TO RELATED APPLICATION

The present application claims priority under 35 U.S.C. §119(a) to Korean application number 10-2016-0022636, filed on Feb. 25, 2016, in the Korean Intellectual Property Office, which is incorporated herein by reference in its entirety.

BACKGROUND

1. Technical Field

Various embodiments generally relate to a data training device and a semiconductor device, and more particularly, to a technology capable of reflecting a training error due to a voltage drop in a semiconductor device.

2. Related Art

An operation speed and a degree of integration has been increased in order to improve semiconductor memory devices. In order to improve an operation speed, there has emerged a so-called synchronous memory device capable of operating in synchronization with a clock provided from an exterior.

A DDR (Double Data Rate) synchronous memory device processes two pieces of data in one clock cycle. Two pieces of data are continuously inputted/outputted through each data input/output pin in synchronization with a rising edge and a falling edge of a clock inputted from an exterior. Accordingly, it is possible to perform a high speed operation because it is possible to achieve twice the bandwidth without increasing a frequency of a clock as compared with a conventional SDR (Single Data Rate) synchronous memory device.

Furthermore, it is important to reduce current consumption in a low power DDR synchronous memory device operating at a low power supply voltage. To this end, the low power DDR synchronous memory device should operate an internal clock only during a required period in order to reduce an operation current.

That is, a conventional low power DDR synchronous memory device reduces an operation current needed by operating an internal clock only for an appropriate time by using a setup time of a chip select signal after a command is applied and disabling the internal clock in the other periods. In this case, only when the rising and is falling edges of the clock exist in a valid window of data DATA, a semiconductor memory device may accurately receive the data DATA.

However, as the operation frequency of a memory device gradually increases, a setup time and a hold time of the chip select signal are narrowly applied. In general, it is evaluated whether the operation performance of a semiconductor memory device is good as a write and read operation is performed at a high speed.

Particularly, a required data output time of a semiconductor memory device that processes a large amount of data, such as an image, is a very important performance index. In addition, as data outputted from a semiconductor memory device is accurately transferred, a system stably operates.

Recently, a semiconductor memory device and a GPU (Graphics Processing Unit) overcome the conventional problems through data training and perform high speed data transfer. The data training indicates a technology for adjusting a skew of data by using a training pattern promised in advance between a controller and the semiconductor memory device in order to stably transfer data for read and write operations.

SUMMARY

Various embodiments are directed to improve the accuracy of training by reflecting a training error due to a voltage drop in a semiconductor device.

In an embodiment, a data training device includes: a write controller configured to align write data; a read controller configured to latch data applied from the write controller and sequentially output the latched data; and an offset compensator configured to adjust a current flowing through a power supply voltage application terminal and a ground voltage application terminal in correspondence to a write signal and a read signal, thereby compensating for an offset in the write controller and the read controller.

In an embodiment, a semiconductor device includes a data training device configured to align and latch write data, and adjust a current flowing through a power supply voltage application terminal and a ground voltage application terminal in correspondence to a write signal and a read signal, thereby compensating for an offset in an input/output terminal of write data and read data.

An embodiment provides an effect capable of improving the accuracy of training by reflecting a training error due to a voltage drop in a semiconductor device.

DETAILED DESCRIPTION

Hereinafter, a data training device and a semiconductor device including the same will be described below with reference to the accompanying drawings through various examples of embodiments.

Figure 1:
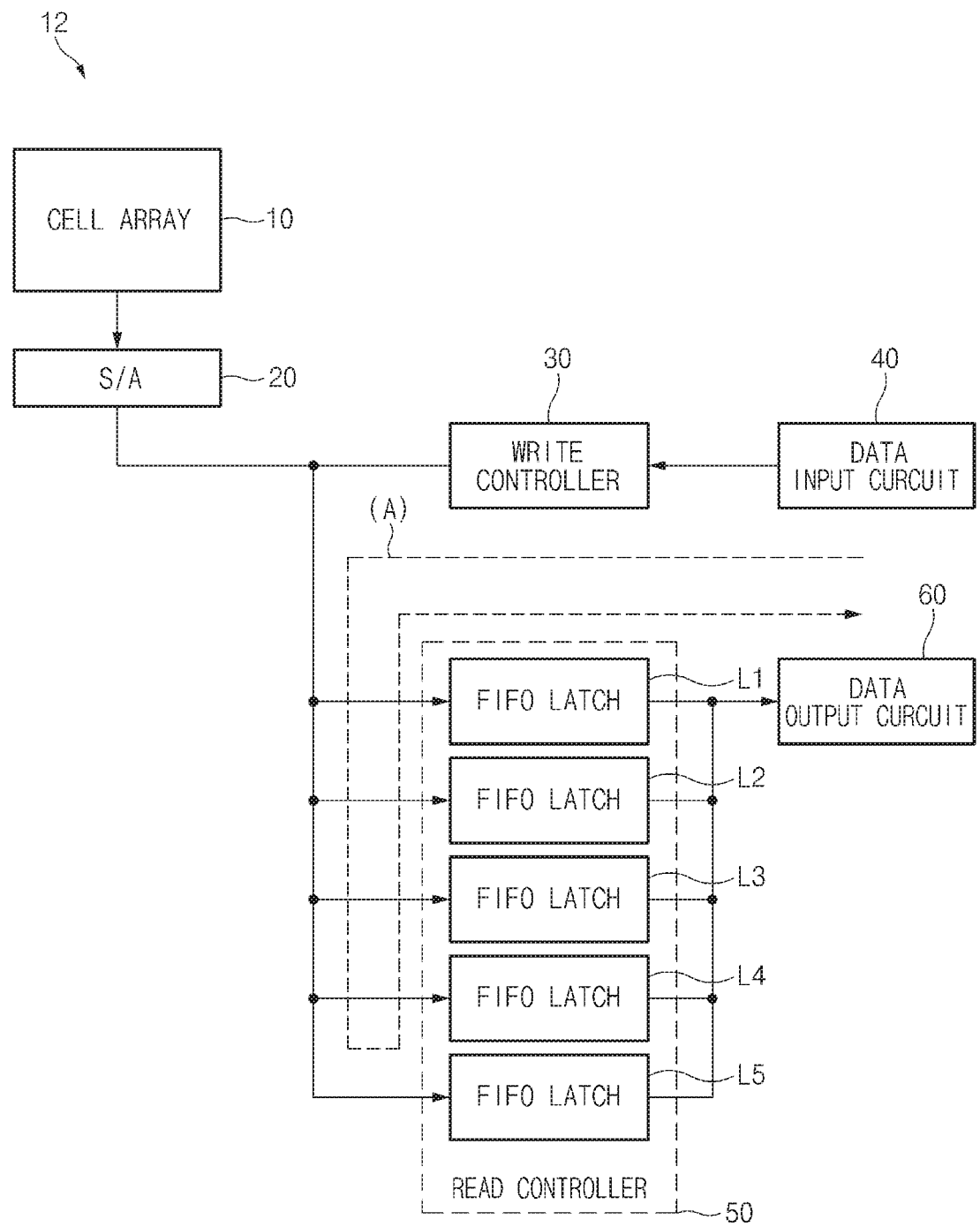
FIG. 1 is a configuration diagram of a prior art data training device.

FIG. 1 is a configuration diagram of a prior art data training device.

The data training device 12 includes a cell array 10, a sense amplifier 20, a write controller 30, a data input circuit 40, a read controller 50, and a data output circuit 60.

The cell array 10 includes a plurality of cells and allows data to be read and written from/to the cell array 10. The sense amplifier 20 senses and amplifies data read from the cell array 10.

The write controller 30 aligns write data applied from the data input circuit 40. The data input circuit 40 buffers data applied is from an exterior and transfers the buffered data to the write controller 30.

The read controller 50 latches data applied from the write controller 30 and outputs the latched data to the data output circuit 60.

Such a read controller 50 includes a plurality of FIFO (First Input First Output) latches L1 to L5. The plurality of FIFO latches L1 to L5 latch the data, which is applied from the write controller 30, in a first input order and output the latched data in the first input order. The data output circuit 60 buffers read data applied from the read controller 50 and outputs the buffered data to an exterior.

As described above, in the data training device 12, data applied through the write controller 30 is stored in the read controller 50 through a path such as (A) without passing through the cell array 10 and the sense amplifier 20. Furthermore, when a read command is applied, the data stored in the read controller 50 is sequentially outputted through the data output circuit 60.

With an increase in operation speed, it is gradually difficult to guarantee the reliability of data transmitted/received in a semiconductor device, for example, a memory device. In order to guarantee the reliability of data, it is necessary to compensate for a transmission time difference of data transferred through each interface.

A semiconductor device includes a data training circuit for is receiving predetermined input data and adjusting setup/hold times thereof. When reading data from a semiconductor memory device (for example, a DRAM (Dynamic Random Access Memory)) or writing data in the memory device, data training is performed in order to adjust a skew of the data.

Such data training circuit is separately provided for each inputted data and performs a function of controlling a setup time and a hold time of each data for a clock to be positioned in an appropriate range.

However, although the setup/hold times have been accurately adjusted for each data inputted from data pins, when the semiconductor device operates at a high speed operation or a skew occurs in each data channel, the setup/hold times of the data may deviate from an appropriate range.

That is, due to physical delay factors in a clock and data transmission processing, rising and falling edges of a data clock may not exist in a valid window of data DATA. In this case, the semiconductor memory device may receive erroneous data. Particularly, in a high speed system, as a valid window (UI) of data is gradually reduced and a data amount is increased, stable data transfer becomes gradually more difficult.

In this regard, in recent high speed specifications, a method is used to latch data at an output terminal of a DQ buffer without passing the data though a circuit for controlling a setup time or a hold is time. However, in such a structure, when DQ data is fast and a DQS (a data strobe signal) is slow, write training is required in order to align the DQ data to a DQS point.

Figure 2:
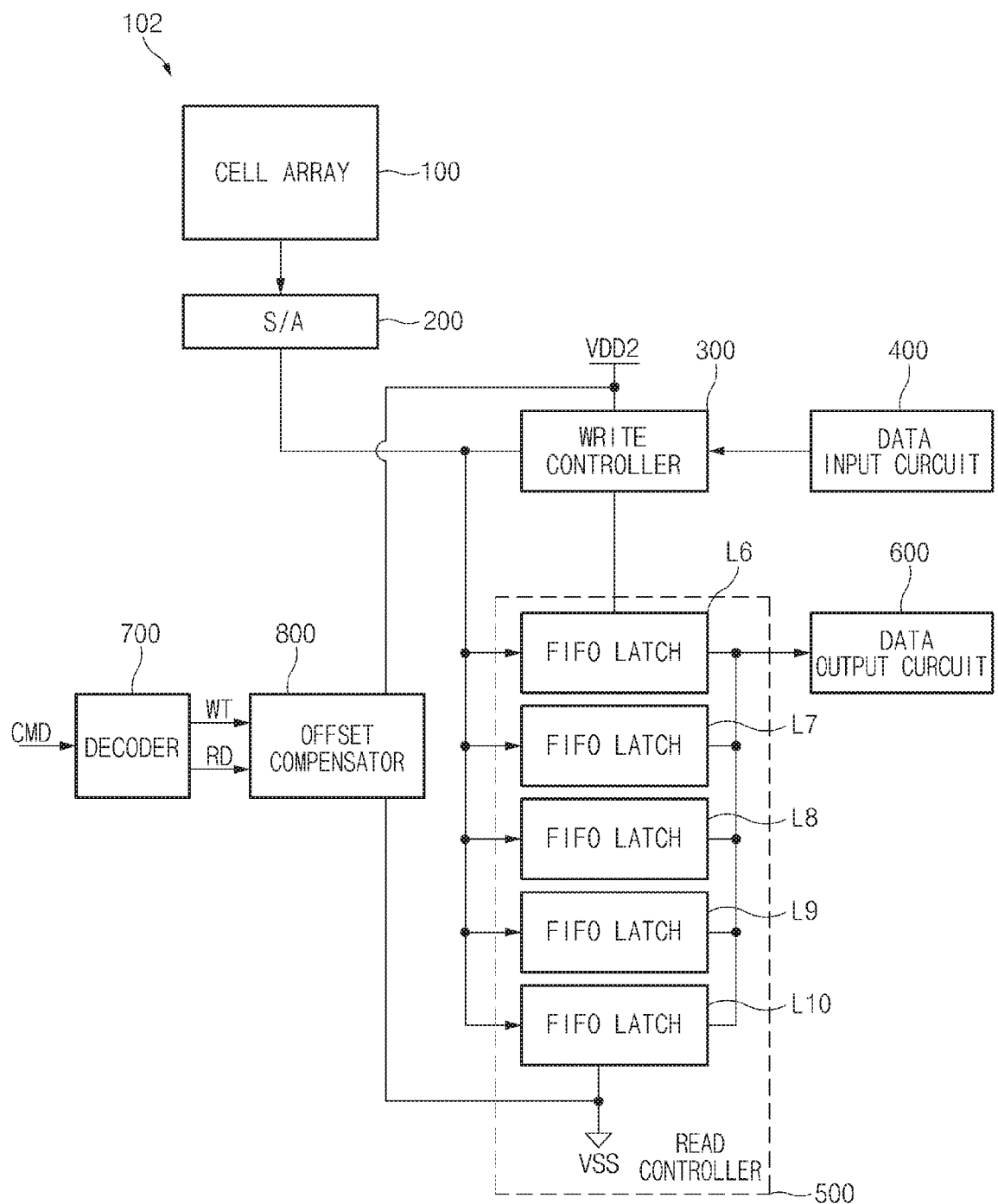
FIG. 2 is a configuration diagram of a data training device according to an embodiment.

FIG. 2 is a configuration diagram of a data training device according to an embodiment.

The data training device 102 according to an embodiment includes a cell array 100, a sense amplifier 200, a write controller 300, a data input circuit 400, a read controller 500, a data output circuit 600, a decoder 700, and an offset compensator 800.

The cell array 100 includes a plurality of cells and allows data to be read and written. The sense amplifier 200 senses and amplifies data read from the cell array 100.

The write controller 300 aligns write data applied from the data input circuit 400 by a write command. The data input 400 circuit buffers data applied from an exterior and transfers the buffered data to the write controller 300.

The read controller 500 latches data applied from the write controller 300 and sequentially outputs the latched data to the data output circuit 600.

Such a read controller 500 includes a plurality of FIFO (First Input First Output) latches L6 to L10. The plurality of FIFO latches L6 to L10 latch the data which is applied from the write controller 300 in the first input order, and the FIFO latches L6 to L10 output the latched data in the first input order when a read command is applied. The data output circuit 600 buffers read data applied from the read controller 500 and outputs the buffered data to an exterior.

The write controller 300 and the read controller 500 may be formed at a data input/output terminal through which write data and read data is inputted/outputted.

The decoder 700 decodes a command signal CMD and outputs a write signal WT and a read signal RD to the offset compensator 800. The decoder 700 may decode a MPC (Multi-Purpose Command) signal, thereby generating the write signal WT and the read signal RD.

The offset compensator 800 adjusts a current of, for example, the input/output terminal flowing through a power supply voltage VDD2 application terminal and a ground voltage VSS application terminal in correspondence to the write signal WT and the read signal RD, and the offset compensator 800 compensates for an offset in the write controller 300 and the read controller 500. That is, in order to compensate for an offset due to a voltage drop in a write FIFO to read FIFO operation, the offset compensator 800 generates a mimic current path and compensates for a current value.

As a semiconductor memory device (for example, a DRAM) supporting an ultra high speed operation is developed, various methods for supporting the ultra high speed operation have been developed. There are various training methods for supporting the ultra high speed operation.

Among the training methods, in a write FIFO to read FIFO method, data is directly written in the cell array 100 and is not read. In a read operation, data is written in to the FIFO latches L6 to L10 and is read from the FIFO latches L6 to L10 using pipes in the DRAM, so that training is performed.

Since such a training method does not need to directly approach the cell array 100, it is advantageous in that it is possible to reduce a data read time and it is not necessary to consider operations of the cell array 100 area to be followed. That is, in the write FIFO to read FIFO operation, the cell array 100 and the sense amplifier 200 do not operate.

However, since the cell array 100 does not directly operate and only input/output circuits, to which data is inputted, operate, there is a difference with an actual write to read operation. In such a case, since current is not actually internally consumed, a variation of a voltage drop does not occur at the cell array 100. Particularly, when training is not normally reflected in a memory device operating at a high speed, read and write operations of a semiconductor device may not be performed.

In this regard, in an embodiment, a training error due to an actual internal voltage drop is compensated through the offset compensator 800, so that it is possible to improve the accuracy of training.

Figure 3:
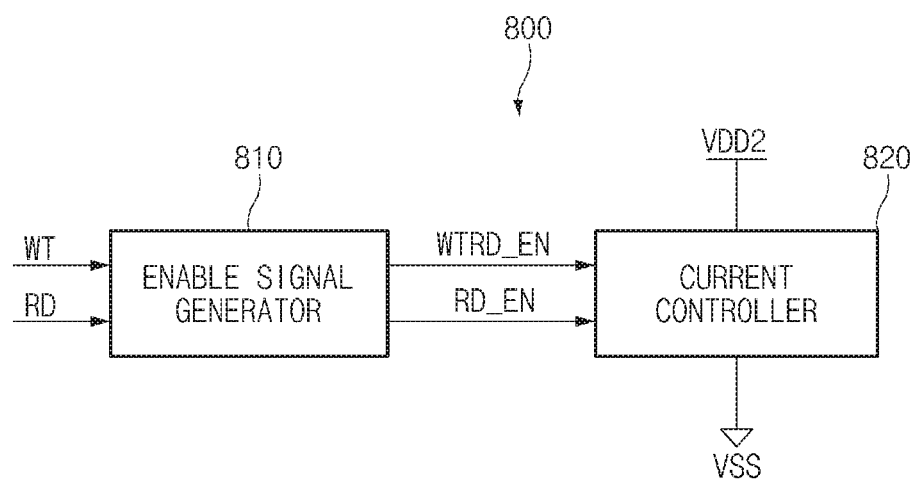
FIG. 3 is a detailed configuration diagram of an offset is corrector of FIG. 2.

FIG. 3 is a detailed configuration diagram of the offset is compensator 800 of FIG. 2.

The offset compensator 800 includes an enable signal generator 810 and a current controller 820.

The enable signal generator 810 controls and outputs pulse widths of a write/read enable signal WTRD_EN and a read enable signal RD_EN in correspondence to the write signal WT and the read signal RD.

The enable signal generator 810 activates the write/read enable signal WTRD_EN when one or more of the write signal WT and the read signal RD are enabled in a write operation or a read operation. The enable signal generator 810 activates the read enable signal RD_EN when the read signal RD is enabled in the read operation.

The current controller 820 operates as a mimic current generator that allows a current to flow through the write controller 300 and the read controller 500 based on the amount of a current consumed when the cell array 100 operates.

Such a current controller 820 adjusts a current flowing through the write controller 300 and the read controller 500 during a period in which the write/read enable signal WTRD_EN and the read enable signal RD_EN are activated. That is, the current controller 820 may generate current values different from each other in the write operation and the read operation, thereby compensating for an offset voltage.

The current controller 820 includes a plurality of switching elements. Accordingly, in the current controller 820, the number of switching elements to be turned on is adjusted according to the activation or deactivation of the write/read enable signal WTRD_EN and the read enable signal RD_EN, so that a current value is adjusted. In such a case, the current controller 820 may reflect an amount of current, which is respectively used in the write operation and the read operation, in a training operation.

Figure 4:
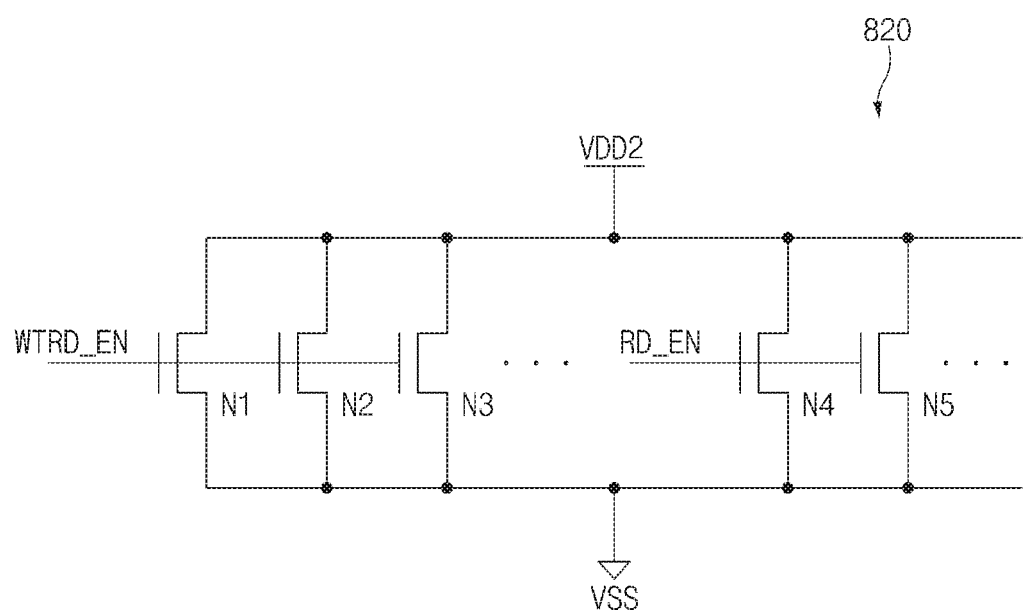
FIG. 4 is a detailed circuit diagram of a current controller of FIG. 3.

FIG. 4 is a detailed circuit diagram of the current controller 820 of FIG. 3.

The current controller 820 includes a plurality of switching elements N1 to N5.

In an embodiment, the case in which the number of switching elements is 5 has been described. Embodiments, however, are not limited thereto and the number of switching elements may be changed according to the range of a current value to be adjusted.

The plurality of switching elements N1 to N5 are coupled in parallel with one another between the power supply voltage VDD2 application terminal and the ground voltage VSS application terminal. The plurality of switching elements N1 to N5 may include NMOS transistors, respectively.

Among the plurality of switching elements N1 to N5, some switching elements N1 to N3 are coupled in parallel with one another between the power supply voltage VDD2 application terminal and the is ground voltage VSS application terminal and receive the write/read enable signal WTRD_EN through common gate terminals thereof. Furthermore, among the plurality of switching elements N1 to N5, some other switching elements N4 and N5 are coupled in parallel with one another between the power supply voltage VDD2 application terminal and the ground voltage VSS application terminal and receive the read enable signal RD_EN through common gate terminals thereof.

In the current controller 820 having such a configuration, when the write/read enable signal WTRD_EN is activated in the write operation, the plurality of switching elements N1 to N3 are turned on, so that a current flowing between the power supply voltage VDD2 application terminal and the ground voltage VSS application terminal is adjusted to a first current value.

Furthermore, when the write/read enable signal WTRD_EN and the read enable signal RD_EN are all activated in the read operation, all of the plurality of switching elements N1 to N5 are turned on, so that a value of a current flowing between the power supply voltage VDD2 application terminal and the ground voltage VSS application terminal is adjusted to a second current value larger than the first current value.

That is, the current controller 820 allows a voltage drop to forcibly occur with the power supply voltage VDD2 and the ground voltage VSS, thereby allowing an offset due to the voltage drop to be reflected as with the case in which a write or read operation is is actually performed in the cell array 100.

In an embodiment, the case in which some switching elements are turned on in a write operation and all the switching elements are turned on in a read operation has been described. That is, the case, in which in the read operation, the write/read enable signal WTRD_EN and the read enable signal RD_EN are all activated, thereby controlling a larger number of switching elements as compared with the write operation to be turned on, has been described. An embodiment, however, is not limited thereto and the number of switching elements to be turned on may be changed.

Figure 5:
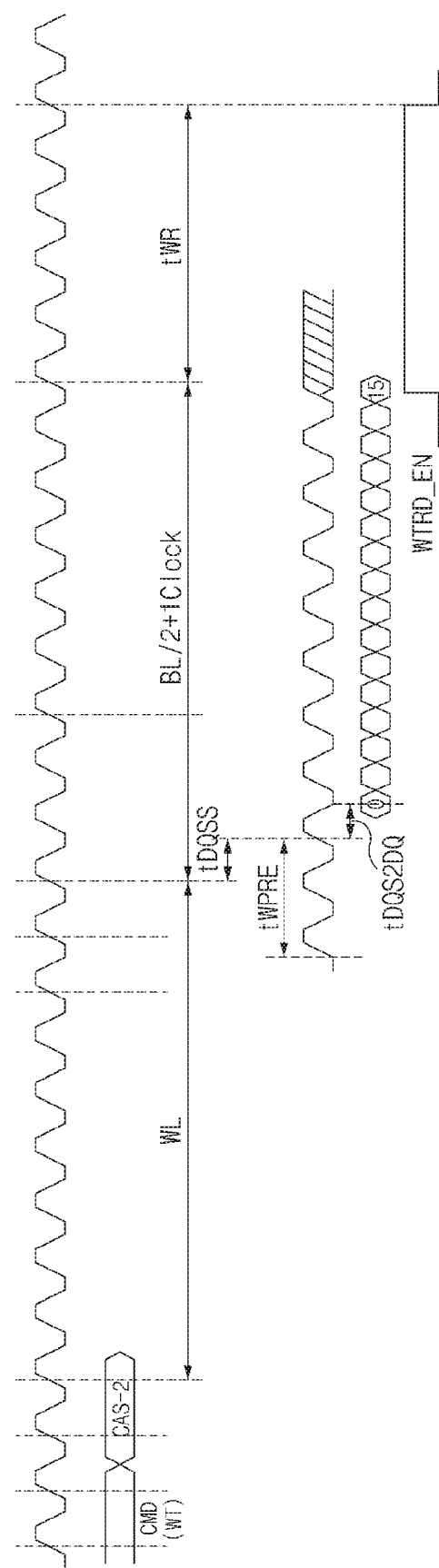
FIG. 5 and FIG. 6 are timing diagrams for explaining operations of a data training device according to an embodiment.
Figure 6:
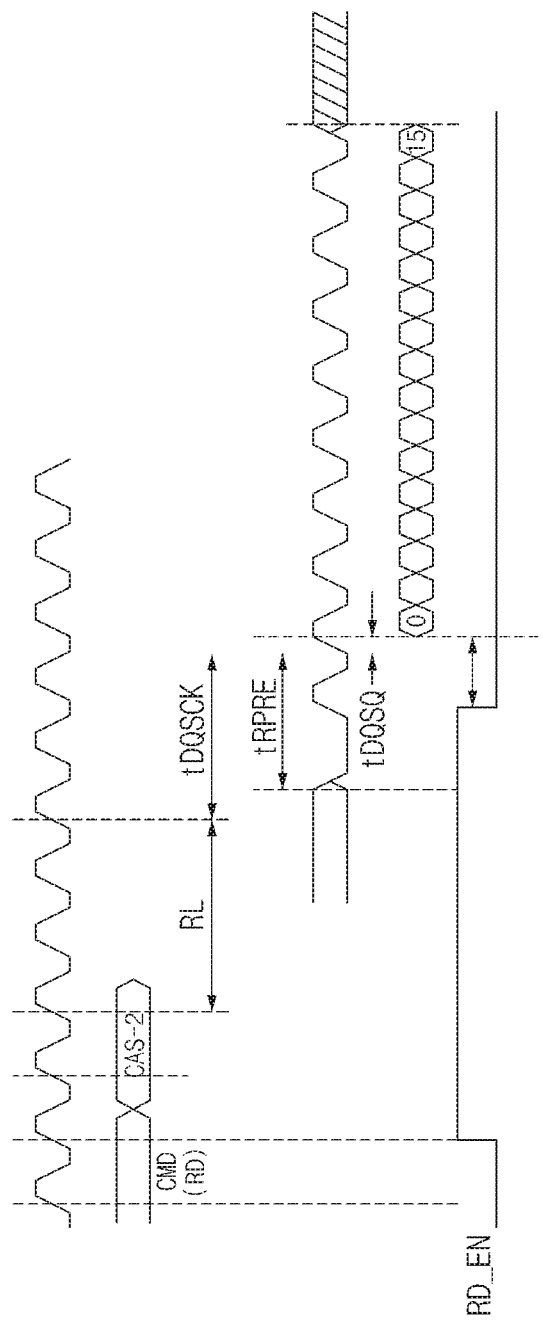

FIG. 5 and FIG. 6 are timing diagrams for explaining operations of the data training device according to an embodiment.

FIG. 5 illustrates a time point at which the write/read enable signal WTRD_EN is activated in the write operation. The decoder 700 decodes the command signal CMD and outputs the write signal WT to the offset compensator 800.

Then, when a CAS signal CAS-2 is applied and a write latency (WL) period passes, data is inputted after a data strobe period tDQSS. When a precharge period tWPRE passes, write data is inputted after a time tDQS2DQ.

After the final data is inputted and the application time point of a data write command passes, the write/read enable signal WTRD_EN is activated during a time tWR (Write Recovery Time) at which a precharge command may be applied. That is, in the write operation, after all the data is written in a cell, the write/read enable signal WTRD_EN may be activated.

A pulse width, in which the write/read enable signal WTRD_EN is activated, may be set in the enable signal generator 810.

That is, after all the write data is inputted, an actual internal cell operation is performed. Since it has only to reflect a current consumed from the time at which the cell operation is performed to the time at which all the write data is written, the write/read enable signal WTRD_EN is enabled when the final data is inputted. When a time tWR passes, the write/read enable signal WTRD_EN is disabled.

FIG. 6 illustrates a time when the read enable signal RD_EN is activated in the read operation. The decoder 700 decodes the command signal CMD and outputs the read signal RD to the offset compensator 800. In the read operation, the read signal RD is applied, so that the write/read enable signal WTRD_EN is activated at the time at which cell data is read.

Then, the CAS signal CAS-2 is applied, so that all the cell data is read and is transferred to a global input/output line GIO. When a read latency (RL) period passes, data is read after a data strobe period tDQSCK. When a precharge period tRPRE passes, read data is outputted after a time tDQSQ.

Before the first data is outputted after the read latency (RL) period, the read enable signal RD_EN is disabled during the precharge period tRPRE. That is, after the cell data is read and the read latency (RL) period passes, the read enable signal RD_EN is disabled at the time when a read data strobe signal tDQSQ operates.

For example, in a period before data applied from the read controller 500 is outputted through the data output circuit 600, the read enable signal RD_EN may be disabled. A pulse width, in which the read enable signal RD_EN is enabled, may be set in the enable signal generator 810.

When a command such as the write signal WT or the read signal RD is continuously inputted at a specific interval, the write/read enable signal WTRD_EN and the read enable signal RD_EN are enabled based on the first command. Furthermore, disable time points of the write/read enable signal WTRD_EN and the read enable signal RD_EN are decided based on the final command.

While various embodiments have been described above, it will be understood to those skilled in the art that the embodiments described are by way of example only. Accordingly, the data training device and the semiconductor device including the same described herein should not be limited based on the described embodiments.

Figure 7:
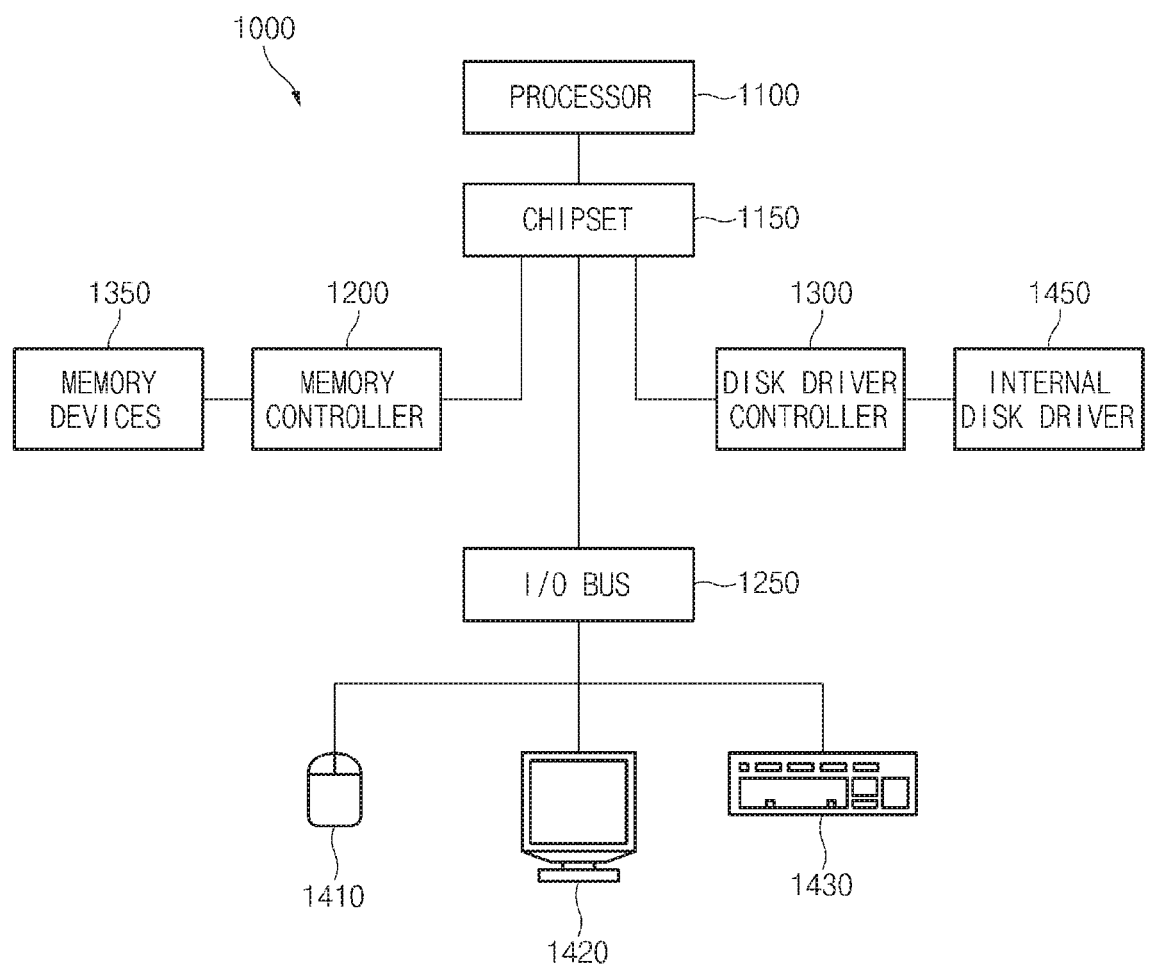
FIG. 7 illustrates a block diagram of an example system employing a semiconductor device in accordance with the various embodiments discussed above with relation to FIGS. 1-6.

The semiconductor devices and/or a data training device discussed above (see FIGS. 1-6) are particularly useful in the design of memory devices, processors, and computer systems. For example, referring to FIG. 7, a block diagram of a system employing a semiconductor device and/or a data training device in accordance with the various embodiments are illustrated and generally designated by a is reference numeral 1000. The system 1000 may include one or more processors (i.e., Processor) or, for example but not limited to, central processing units ("CPUs") 1100. The processor (i.e., CPU) 1100 may be used individually or in combination with other processors (i.e., CPUs). While the processor (i.e., CPU) 1100 will be referred to primarily in the singular, it will be understood by those skilled in the art that a system 1000 with any number of physical or logical processors (i.e., CPUs) may be implemented.

A chipset 1150 may be operably coupled to the processor (i.e., CPU) 1100. The chipset 1150 is a communication pathway for signals between the processor (i.e., CPU) 1100 and other components of the system 1000. Other components of the system 1000 may include a memory controller 1200, an input/output ("I/O") bus 1250, and a disk driver controller 1300. Depending on the configuration of the system 1000, any one of a number of different signals may be transmitted through the chipset 1150, and those skilled in the art will appreciate that the routing of the signals throughout the system 1000 can be readily adjusted without changing the underlying nature of the system 1000.

As stated above, the memory controller 1200 may be operably coupled to the chipset 1150. The memory controller 1200 may include at least one semiconductor device and/or a data training device as discussed above with reference to FIGS. 1-6. Thus, the memory controller 1200 can receive a request provided from the is processor (i.e., CPU) 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device and/or a data training device as discussed above with relation to FIGS. 1-6, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420, and 1430. The I/O devices 1410, 1420, and 1430 may include, for example but are not limited to, a mouse 1410, a video display 1420, or a keyboard 1430. The I/O bus 1250 may employ any one of a number of communications protocols to communicate with the I/O devices 1410, 1420, and 1430. In an embodiment, the I/O bus 1250 may be integrated into the chipset 1150.

The disk driver controller 1300 may be operably coupled to is the chipset 1150. The disk driver controller 1300 may serve as the communication pathway between the chipset 1150 and one internal disk driver 1450 or more than one internal disk driver 1450. The internal disk driver 1450 may facilitate disconnection of the external data storage devices by storing both instructions and data. The disk driver controller 1300 and the internal disk driver 1450 may communicate with each other or with the chipset 1150 using virtually any type of communication protocol, including, for example but not limited to, all of those mentioned above with regard to the I/O bus 1250.

It is important to note that the system 1000 described above in relation to FIG. 7 is merely one example of a system 1000 employing a semiconductor device and/or a data training device as discussed above with relation to FIGS. 1-6. In alternate embodiments, such as, for example but not limited to, cellular phones or digital cameras, the components may differ from the embodiments illustrated in FIG. 7.

What is claimed is:
1. A data training device comprising:
  a write controller configured to align write data;
  a read controller configured to latch data applied from the write controller and sequentially output the latched data; and
  an offset compensator configured to adjust a current flowing through a power supply voltage application terminal and a ground voltage application terminal in correspondence to a write signal and a read signal, thereby compensating for an offset in the write controller and the read controller,
  wherein the write controller, the read controller and the offset compensator receive voltages through the power supply voltage application terminal and the ground voltage application terminal, respectively.
2. The data training device of claim 1, further comprising:
  a data input circuit configured to buffer data applied from an exterior and output the buffered data to the write controller.
3. The data training device of claim 1, further comprising:
  a data output circuit configured to buffer read data applied from the read controller and output the buffered data to an exterior.
4. The data training device of claim 1, further comprising:
  a decoder configured to decode a command signal and output the write signal and the read signal to the offset compensator.
5. The data training device of claim 4, wherein the decoder decodes a MPC (Multi-Purpose Command) signal, thereby generating the write signal and the read signal.

6. The data training device of claim 1, wherein the read controller includes a plurality of FIFO (First Input First Output) latches.

7. The data training device of claim 1, wherein the offset compensator comprises:
- an enable signal generator configured to control and output pulse widths of a write/read enable signal and a read enable signal in correspondence to the write signal and the read signal; and
- a current controller configured to control a current flowing through the write controller and the read controller in correspondence to the write/read enable signal and the read enable signal.

8. The data training device of claim 7, wherein the enable signal generator activates the write/read enable signal when one or more of the write signal and the read signal are enabled.

9. The data training device of claim 7, wherein the enable signal generator activates the read enable signal when the read signal is enabled.

10. The data training device of claim 7, wherein the current controller controls the current based on an amount of a current consumed when a cell array operates.

11. The data training device of claim 7, wherein the current controller adjusts a current flowing through the write controller and the read controller during a period in which the write/read enable signal and the read enable signal are activated.

12. The data training device of claim 7, wherein the current controller generates current values different from each other in a write operation and a read operation, thereby compensating for an offset voltage.

13. The data training device of claim 7, wherein the current controller includes a plurality of switching elements and adjusts a current value through adjustment of a number of switching elements to be turned on according to activation or deactivation of the write/read enable signal and the read enable signal.

14. The data training device of claim 7, wherein the current controller includes a plurality of switching elements which are coupled in parallel with one another between the power supply voltage application terminal and the ground voltage application terminal and receive the write/read enable signal and the read enable signal through gate terminals thereof.

15. The data training device of claim 14, wherein, among the plurality of switching elements, some switching elements receive the write/read enable signal through gate terminals thereof, and other switching elements receive the read enable signal through gate terminals thereof.

16. The data training device of claim 14, wherein, in the current controller, some switching elements are turned on in a write operation and all the switching elements are turned on in a read operation.

17. The data training device of claim 7, wherein the write/read enable signal is activated during a write recovery time (tWR) after all data is written in a cell in a write operation.

18. The data training device of claim 7, wherein the read enable signal is activated at a time at which the read signal is enabled and is disabled during a precharge period before first data is outputted.

19. A semiconductor device comprising a data training device configured to align and latch write data, and adjust a current flowing through a power supply voltage application terminal and a ground voltage application terminal in correspondence to a write signal and a read signal, thereby compensating for an offset in an input/output terminal of write data and read data
- wherein the data training device comprises:
- a write controller configured to align the write data;
- a read controller configured to latch data applied from the write controller and sequentially output the latched data; and
- an offset compensator configured to adjust a current of the input/output terminal in correspondence to the write signal and the read signal,
- wherein the write controller, the read controller and the offset compensator receive voltages through the power supply voltage application terminal and the ground voltage application terminal, respectively.

* * * * *